United States Patent [19]
Chiba et al.

[11] Patent Number: 5,726,548
[45] Date of Patent: Mar. 10, 1998

[54] MOVING STAGE APPARATUS AND SYSTEM USING THE SAME

[75] Inventors: Shinichi Chiba, Tokyo; Kotaro Akutsu, Machida, both of Japan

[73] Assignee: Canon Kabushiki Kaisha, Tokyo, Japan

[21] Appl. No.: 593,194

[22] Filed: Jan. 29, 1996

Related U.S. Application Data

[63] Continuation of Ser. No. 159,218, Nov. 30, 1993, abandoned.

[30] Foreign Application Priority Data

Dec. 18, 1992 [JP] Japan .................. 4-338802

[51] Int. Cl.$^6$ .................. G05B 1/06; B65G 49/00
[52] U.S. Cl. .................. 318/625; 318/632; 318/628; 318/640; 384/12; 384/13
[58] Field of Search .................. 318/560–689, 318/135, 38; 310/12, 13, 328, 317, 333; 250/442.1, 201, 492.1; 355/67, 133, 77, 53, 54; 33/180 R, 1 M, DIG. 2; 356/358; 384/12, 13

[56] References Cited

U.S. PATENT DOCUMENTS

| | | | |
|---|---|---|---|
| 4,080,009 | 3/1978 | Marathe et al. | 305/3.5 |
| 4,425,537 | 1/1984 | Phillips et al. | 318/640 |
| 4,442,388 | 4/1984 | Phillips | 318/640 |
| 4,485,339 | 11/1984 | Trost | 318/640 |
| 4,496,239 | 1/1985 | Isohata et al. | 355/30 |
| 4,506,204 | 3/1985 | Galburt | 318/653 |
| 4,506,205 | 3/1985 | Trost et al. | 318/653 |
| 4,507,597 | 3/1985 | Trost | 318/653 |
| 4,562,392 | 12/1985 | Davis et al. | 318/572 |
| 4,563,820 | 1/1986 | Isohata | 33/180 R |
| 4,654,571 | 3/1987 | Hinds | 318/687 |
| 4,687,980 | 8/1987 | Phillips et al. | 318/640 |
| 4,742,286 | 5/1988 | Phillips | 318/640 |
| 4,744,675 | 5/1988 | Sakino et al. | 384/12 |
| 4,748,477 | 5/1988 | Isohata et al. | 355/53 |
| 4,749,867 | 6/1988 | Matsushita et al. | 250/442.1 |
| 4,766,465 | 8/1988 | Takahashi | 250/49.1 |
| 4,814,680 | 3/1989 | Hulsing | 318/561 |
| 4,928,030 | 5/1990 | Culp | 310/328 |
| 4,977,361 | 12/1990 | Philips et al. | 318/640 |
| 4,993,696 | 2/1991 | Furukawa et al. | 269/73 |
| 5,043,621 | 8/1991 | Culp | 310/316 |
| 5,153,494 | 10/1992 | Hollis, Jr. | 318/640 |
| 5,184,055 | 2/1993 | Ohishi et al. | |
| 5,382,095 | 1/1995 | Akutsu | 384/100 |

FOREIGN PATENT DOCUMENTS

| | | |
|---|---|---|
| 58-25637 | 2/1983 | Japan . |
| 63-101515 | 5/1988 | Japan . |
| 427218 | 1/1992 | Japan . |

*Primary Examiner*—Paul Ip
*Attorney, Agent, or Firm*—Fitzpatrick, Cella, Harper & Scinto

[57] ABSTRACT

A movable stage apparatus and an exposure system including a moving stage apparatus, includes a movable member capable of being driven by a driving mechanism, and first and second sets of fluid bearings. The first set of fluid bearings supports the movable member. The second set of fluid bearings is connected to a plurality of driving elements. The plurality of driving elements are connected to the movable member and are displaceable in a direction in which the movable member is supported by the first set of fluid bearings. The second set of fluid bearings supports the movable member. Also provided is a controller for applying a voltage to the plurality of driving elements so as to compensate for the posture of the movable member when the posture of the movable member changes in response to being driven by the driving mechanism. The system further includes an exposure apparatus for exposing an object to be exposed which is mounted on the movable member.

9 Claims, 7 Drawing Sheets

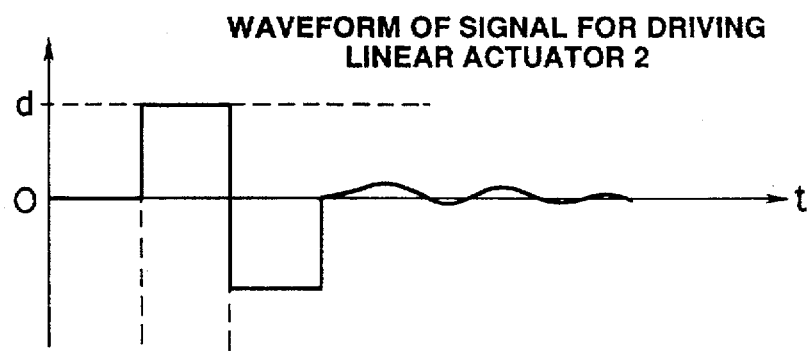
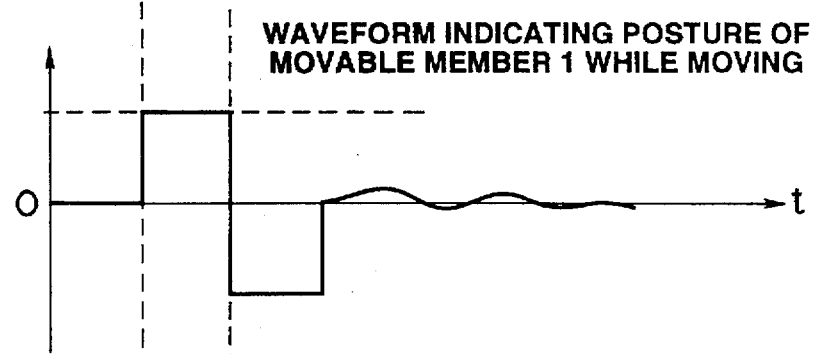
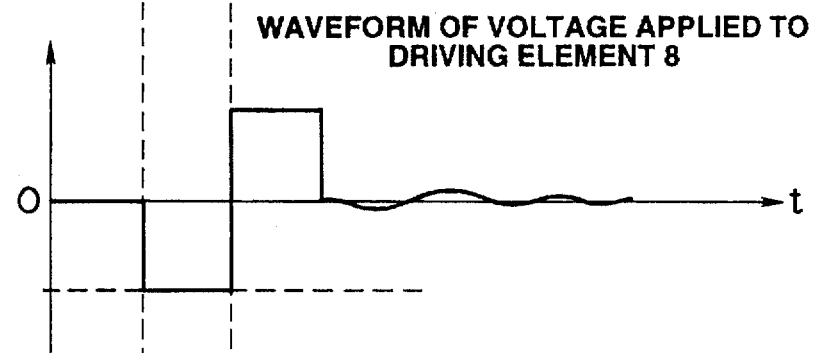
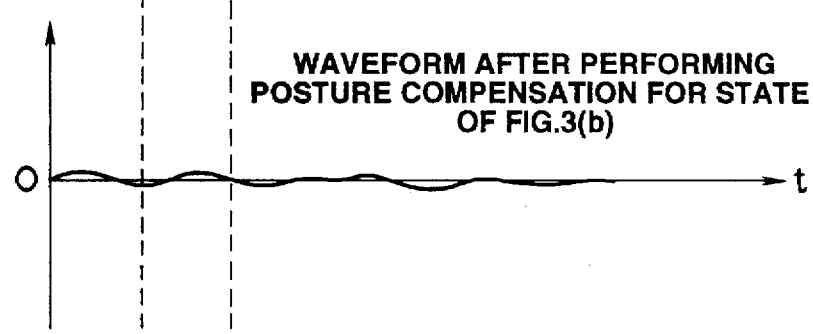

MOVING STAGE APPARATUS AND SYSTEM USING THE SAME

This application is a continuation of application Ser. No. 08/159,218 filed Nov. 30, 1993, now abandoned.

BACKGROUND OF THE INVENTION

1. Field of the Invention

This invention relates to a moving stage which can perform a positioning operation at a predetermined position with high speed and high accuracy in a semiconductor exposure apparatus, a precision machine tool, a precision measuring apparatus or the like.

2. Description of the Related Art

Moving stages, in which a movable member is supported by hydrostatic fluid bearings in a non-contact state in order to perform a high-precision and high-speed positioning operation, are known. When the movable member is driven by the thrust of linear actuators or the like, if the center of gravity of the movable member does not coincide with the driving point, a change in the posture of the movable member due to the resulting moment causes a rotational motion of the movable member. This is a factor in causing a delay in the positioning of the moving stage.

This problem is overcome in a moving stage (proposed in Japanese Patent Laid-open Application (Kokai) No. 58-25637 (1983)), in which the posture of a movable member is maintained by controlling the pressure of a fluid supplied to hydrostatic fluid bearings. In another moving stage (proposed in Japanese Patent Laid-open Application (Kokai) No. 63-101515 (1988)) which overcomes the above-described problem, throttle valves of exhaust nozzles from which compressed air is ejected can be adjusted using driving means, such as piezoelectric elements or the like, so that a movable member is not inclined. Thus, the stiffness of hydrostatic fluid bearings is increased.

In still another moving stage (proposed in Japanese Utility Model Laid-open Application (Kokai) No. 4-27218 (1992)) which overcomes the above-described problem, hydrostatic fluid bearings are provided at a guide. When a load is applied in a direction perpendicular to the direction of movement, the entire guide is displaced using piezoelectric elements disposed below it to correct the inclination of a movable member.

However, in the moving stages disclosed in Japanese Patent Laid-open Application (Kokai) Nos. 58-25637 (1983) and 63-101515 (1988) in which pressure and the flow rate are controlled, respectively, the response to such control at a high frequency cannot be expected because of the compressibility of air.

On the other hand, when piezoelectric elements are provided in series below a guide to compensate for the posture of a movable member, as proposed in Japanese Utility Model Laid-open Application (Kokai) No. 4-27218, the stiffness of the guide of the hydrostatic fluid bearings decreases. Hence, it becomes difficult to guide the movable member very precisely unless the servo stiffness is increased. In addition, when piezoelectric elements are provided at the guide, the size and weight of the apparatus tend to increase, causing difficulty in the quick response of the guide to be driven and in dynamic compensation of the posture of the moving stage.

SUMMARY OF THE INVENTION

The present invention has been made in consideration of the above-described problems.

It is an object of the present invention to provide a high-precision and high-speed moving stage apparatus which has the function of compensating for a change in the posture of a moving member.

According to one aspect, the present invention which achieves this object relates to a moving stage apparatus comprising a movable member capable of being driven by a driving mechanism, first and second sets of fluid bearings, a plurality of driving elements, and a controller. The first set of fluid bearings supports the movable member, the plurality of driving elements are connected to the movable member and are displaceable in the direction in which the movable member is supported by the first set of fluid bearings. The second set of fluid bearings is connected to the plurality of driving elements and supports the movable member. The controller applies a voltage to the plurality of driving elements so as to compensate for the posture of the movable member when the posture of the movable member changes in response to be driven by the driving mechanism.

The controller can control the waveform of the voltage applied to the plurality of driving elements based on a driving signal supplied by the driving mechanism. In one embodiment the apparatus further comprises an acceleration detector for detecting the acceleration of the movable member in a moving direction. In this embodiment the controller controls the waveform of the voltage applied to the plurality of driving elements based on a detection output of the acceleration detector. According to another embodiment the apparatus can comprise a displacement detector for detecting the displacement of the movable member in a vertical direction. In this embodiment the controller controls the waveform of the voltage applied to the plurality of driving elements based on a detection output of the displacement detector.

The first set of fluid bearings can support substantially the entire weight of the movable member. In addition, the apparatus can further comprise a plurality of supports, each support mounting one of the driving elements and one of the fluid bearings of the second set of fluid bearings on the movable member. Each of the supports includes a hinged portion. In addition, each driving element can be integral with one of the fluid bearings of the second set of fluid bearings. According to one embodiment, the first and second sets of fluid bearings are hydrostatic fluid bearings and each driving element comprises a piezoelectric element.

According to another aspect, the present invention which achieves this object relates to an exposure system including a moving stage apparatus. The system comprises a movable member mounting an object to be exposed and capable of being driven by a driving mechanism, first and second sets of fluid bearings, a plurality of driving elements, a controller, and exposure means. The first set of fluid bearings supports the movable member. The plurality of driving elements are connected to the movable member and are displaceable in the direction in which the movable member is supported by the first set of fluid bearings. The second set of fluid bearings is connected to the plurality of driving elements and supports the movable member. The controller applies a voltage to the plurality of driving elements so as to compensate for the posture of the movable member when the posture of the movable member changes in response to being driven by the driving mechanism. The exposure means exposes the object to be exposed. In addition, the object to be exposed can comprise a wafer. In this embodiment, the exposure means exposes and transfers a pattern of the mask onto the wafer.

The controller can control the waveform of the voltage applied to the plurality of driving elements based on a driving signal supplied to the driving mechanism. In another embodiment the apparatus further comprises an acceleration detector for detecting the acceleration of the movable member in a moving direction. In this embodiment, the controller controls the waveform of the voltage applied to the plurality of driving elements based on a detection output of the acceleration detector. According to another embodiment the apparatus can comprise a displacement detector for detecting the displacement of the movable member in a vertical direction. In this embodiment the controller controls the waveform of the voltage applied to the plurality of driving elements based on a detection output of the displacement detector.

The first set of fluid bearings can support substantially the entire weight of the movable member. In addition, the apparatus can further comprise a plurality of supports, each support mounting one of the driving elements and one of the fluid bearings of the second set of fluid bearings on the movable member. Each of the supports includes a hinged portion. In addition, each driving element is integral with one of the fluid bearings of the second set of fluid bearings. According to one embodiment the first and second sets of fluid bearings are hydrostatic fluid bearings and each driving element comprises a piezoelectric element.

BRIEF DESCRIPTION OF THE DRAWINGS

FIGS. 3(a) through 3(d) are diagrams illustrating the waveforms of signals for explaining the operation of the first embodiment;

DESCRIPTION OF THE PREFERRED EMBODIMENTS

First Embodiment

Figure 1A:
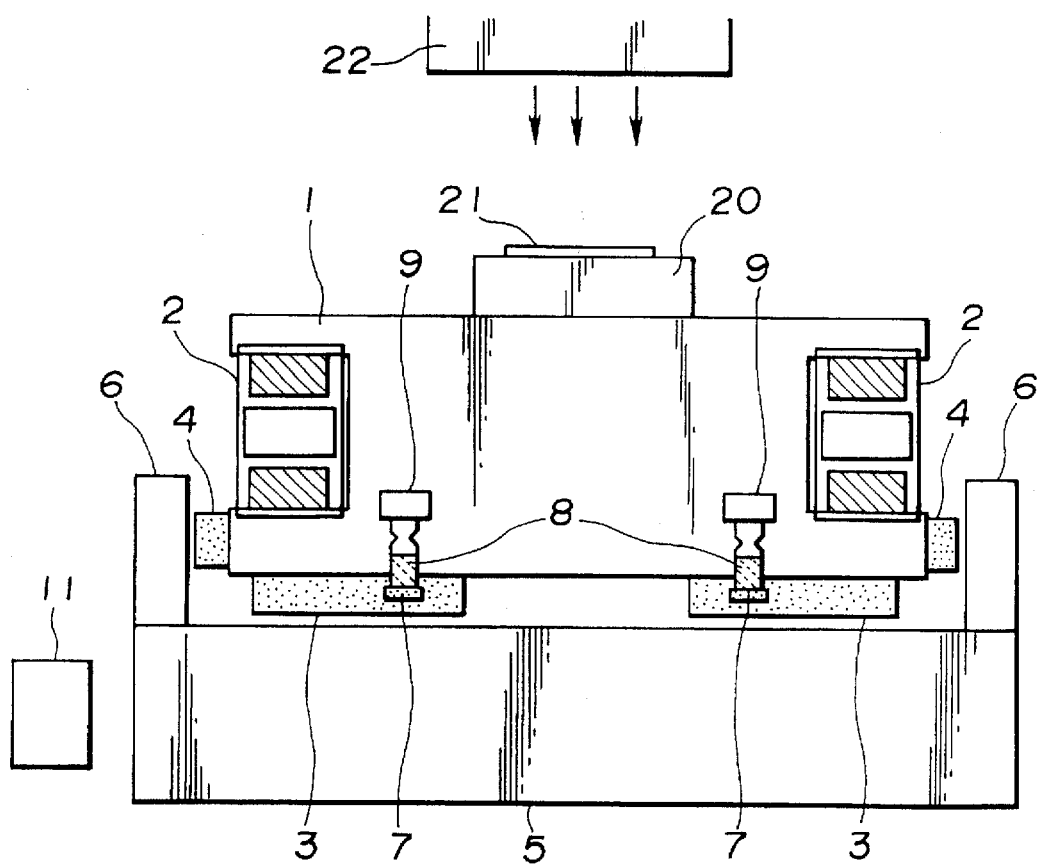
FIGS. 1(a) and 1(b) are front and top views, respectively, illustrating the configuration of an apparatus according to a first embodiment of the present invention.
Figure 1B:
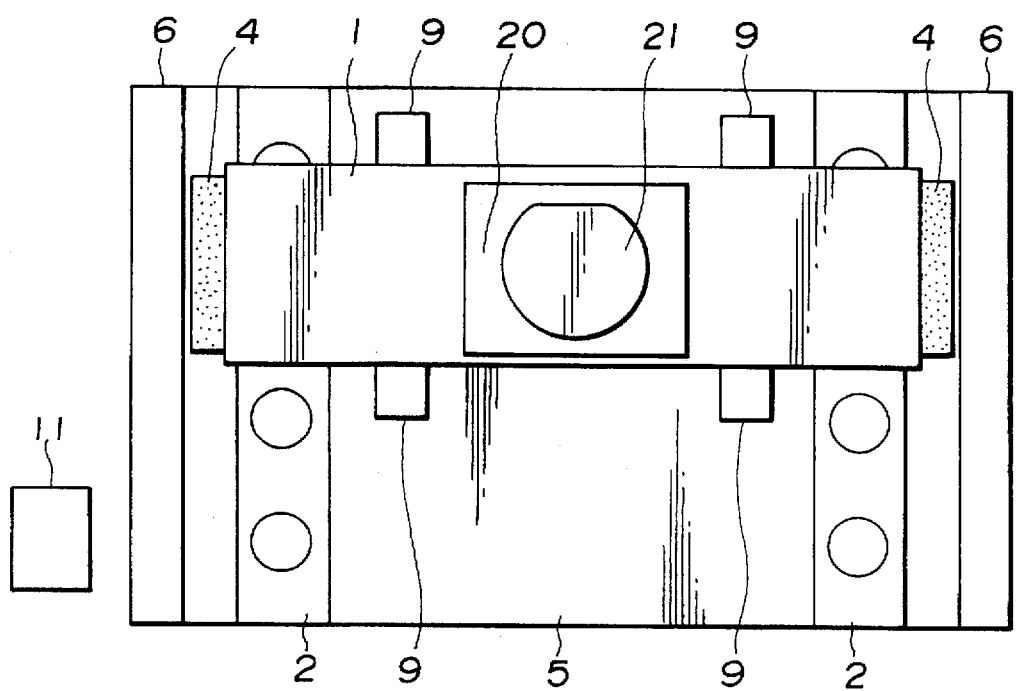
Figure 2:
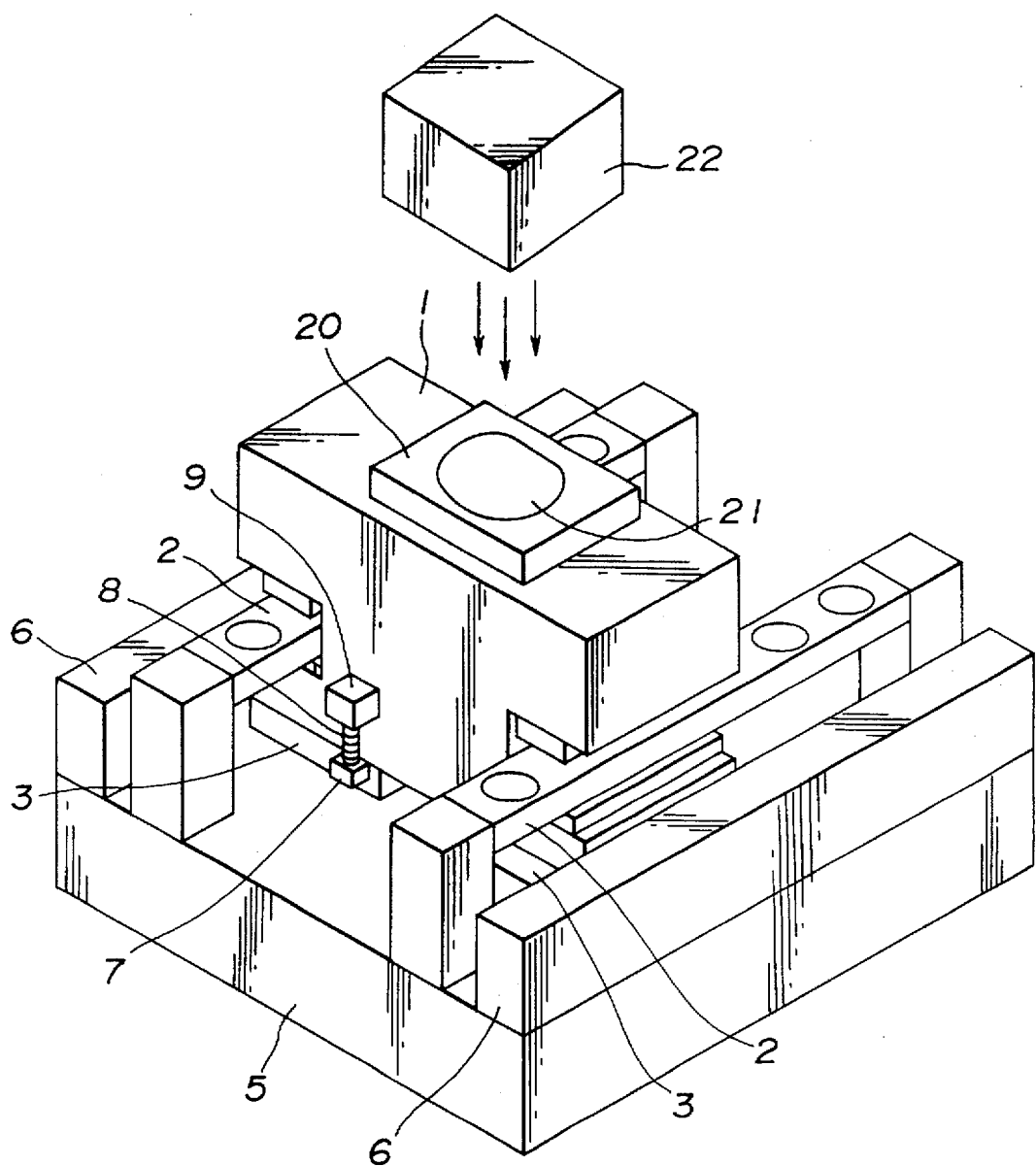
FIG. 2 is a perspective view illustrating the configuration of the entire apparatus of the first embodiment.

FIGS. 1(a) and 1(b) are diagrams illustrating the configuration of a one-axis stage apparatus used in a semiconductor exposure apparatus according to a first embodiment of the present invention. FIG. 1(a) is a front view of the apparatus, and FIG. 1(b) is a top plan view of the apparatus. FIG. 2 is a perspective view of the entire apparatus. In order to avoid complexity in the drawings, the configuration of a one-axis (X) stage apparatus has been shown in the present embodiment. In an actual semiconductor exposure apparatus, however, a two-axes (XY) stage apparatus is used. The following configuration is adopted in at least one of the two axes of such a two-axes stage apparatus.

In FIGS. 1(a) and 1(b), movable member 1 constitutes a moving stage. Wafer chuck 20, which holds semiconductor wafer 21, is mounted on movable member 1. Exposure unit 22, which incorporates a light source, a mask, a projection optical system and the like, exposes and transfers a mask pattern onto wafer 21. Linear actuators 2 drive moving member 1 without making contact therewith in a non-contact state using a magnetic force or the like. The apparatus also includes first and second sets of hydrostatic fluid bearings. The first set of hydrostatic fluid bearings comprises hydrostatic fluid bearings 3 and 4. The second set of hydrostatic fluid bearings comprises hydrostatic fluid bearings 7. The hydrostatic fluid bearings 3 are mounted on movable member 1 to support it in the vertical direction. Hydrostatic fluid bearings 4 are mounted on movable member 1 and support movable member 1 in the horizontal direction. Reference numeral 5 represents a guide in the vertical direction. Reference numeral 6 represents a guide in the horizontal direction. Guide 5 is a surface plate whose upper surface is used as a guide face. Each member 6, whose side is used as a guide face, is mounted on guide 5. Movable member 1 is supported by hydrostatic fluid bearings 3 and 4 without contacting the guide faces of guide 5 and guides 6. Each driving element 8, such as a piezoelectric element or the like, is fixed to the corresponding hydrostatic fluid bearing 7, and can be displaced in a direction perpendicular to the guide face of guide 5. Supports 9 are used for mounting driving elements 8 and hydrostatic fluid bearings 7 on movable member 1. Supports 9 include hinge portions for avoiding any inclination produced in hydrostatic fluid bearings 7 and driving elements 8 due to a load in the horizontal direction and deformation of movable member 1. Each second hydrostatic fluid bearing 7 is integral with the corresponding driving element 8. Movable member 1 is also held by second hydrostatic fluid bearings 7 via driving elements 8 with respect to the guide face of guide 5. The above-described components constitute a posture compensation mechanism for reducing a change in the posture of movable member 1 caused by a moment while movable member 1 moves to a very small extent. The integrated pairs of second hydrostatic fluid bearing 7 and driving element 8 have the stiffness required for posture compensation. Controller 11 controls the driving of linear actuators 2 and driving elements 8.

Movable member 1 is driven by the thrust of linear actuators 2. If the center of gravity of movable member 1 does not coincide with the driving point, a rotational motion is produced in movable member 1 due to a change in the posture thereof caused by a moment. In the above-described configuration, a change in the posture is suppressed by the posture compensation mechanism. Such a function will be described with reference to FIGS. 3(a) through 3(d).

FIG. 3(a) illustrates the waveform of a signal for driving linear actuators 2. FIG. 3(b) illustrates a waveform indicating the posture of movable member 1 while moving. FIG. 3(c) illustrates the waveform of a voltage applied to driving elements 8 in order to cancel a change in the posture of movable member 1 while moving. FIG. 3(d) illustrates a waveform indicating the posture of movable member 1 obtained when driving elements 8 are displaced to cancel a change in the posture of movable member 1 while moving.

First, a voltage is not applied to driving elements 8, and a signal having a waveform as shown in FIG. 3(a) is input to linear actuators 2 from controller 11 to drive movable member 1. The posture of movable member 1 while moving with respect to guide 5 is monitored by a displacement detector (not shown), such as an interferometer, an encoder or the like. The displacement detector outputs a waveform, indicating the posture of movable member 1 while moving, to controller 11, as shown in FIG. 3(b). By observing the waveform shown in FIG. 3(b), the controller 11 can confirm that the posture of the movable member 1 has changed before compensating for such a change in posture. When controller 11 confirms such a change in posture in movable member 1, controller 11 then adjusts the voltage applied to driving elements 8 so that the change in the posture of movable member 1 while moving is reduced to a very small value. The voltage applied at that time has a waveform as shown in FIG. 3(c), i.e., a waveform whose phase is opposite to that of the waveform shown in FIG. 3(b) in order to cancel the change in the posture of movable member 1 while moving. By providing such a driving signal having an opposite-phase waveform, the posture compensation mechanism functions to instantaneously cancel the change in the posture of movable member 1 shown in FIG. 3(b). As a result, the posture of movable member 1 while moving is improved as indicated by the waveform shown in FIG. 3(d). Controller 11 generates a signal as shown in FIG. 3(c) based on the signal input to linear actuators 2 as shown in FIG. 3(a) to apply the corresponding voltage to driving elements 8. It is thereby possible to cancel a change in the posture of movable member 1 while moving.

According to the present embodiment, the function of performing dynamic posture compensation for a moving stage, in which it is intended to provide high stiffness and high precision by using hydrostatic fluid bearings, is added to provide higher stiffness and cancel rotational motion due to a change in the posture of the moving stage. Thus, the positioning time of the moving stage can be shortened while maintaining its high-precision property.

This function is separated from the other functions of the device so that the posture compensation mechanism functions only for compensating for rotational motion due to a moment. Such separation is accomplished by using hydrostatic fluid bearings 3 for the guide for supporting the weight of movable member 1. Hence, only a small load carrying capacity is required for the posture compensation mechanism. That is, a high stiffness or a large stroke so as to support the weight of movable member 1 is not required. Accordingly, the size of hydrostatic fluid bearings 7 and driving elements 8, i.e., the posture compensation mechanism, can be reduced, whereby the size of the entire apparatus can be reduced.

Second Embodiment

Figure 4A:
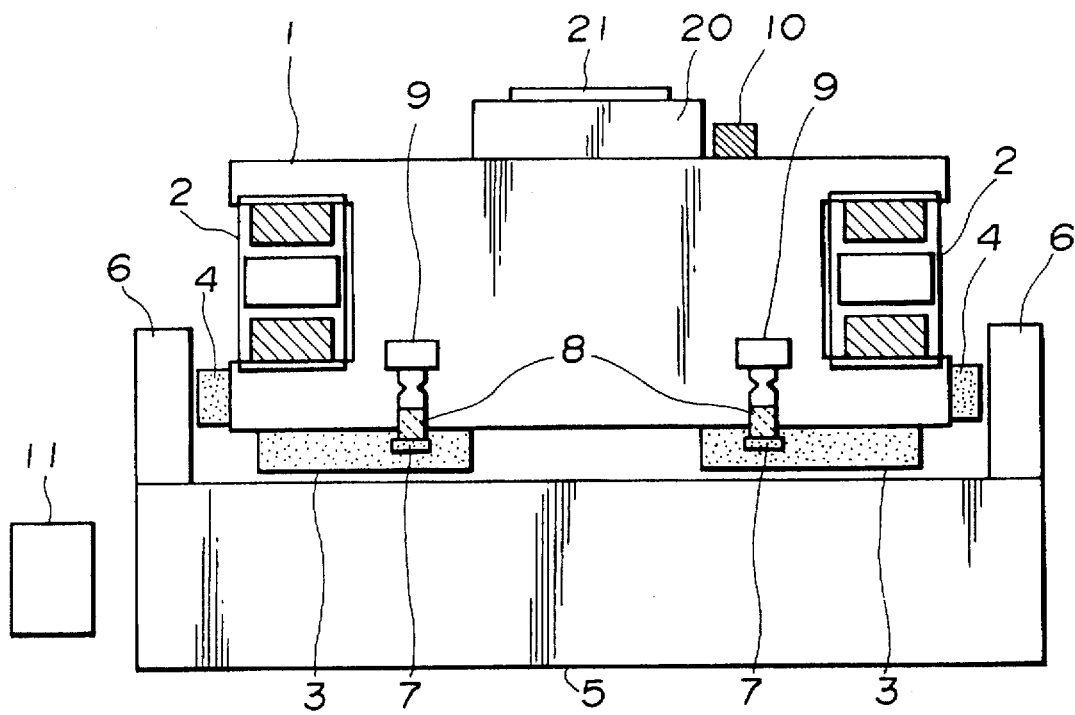
FIGS. 4(a) and 4(b) are front and top views, respectively, illustrating the configuration of an apparatus according to a second embodiment of the present invention.
Figure 4B:
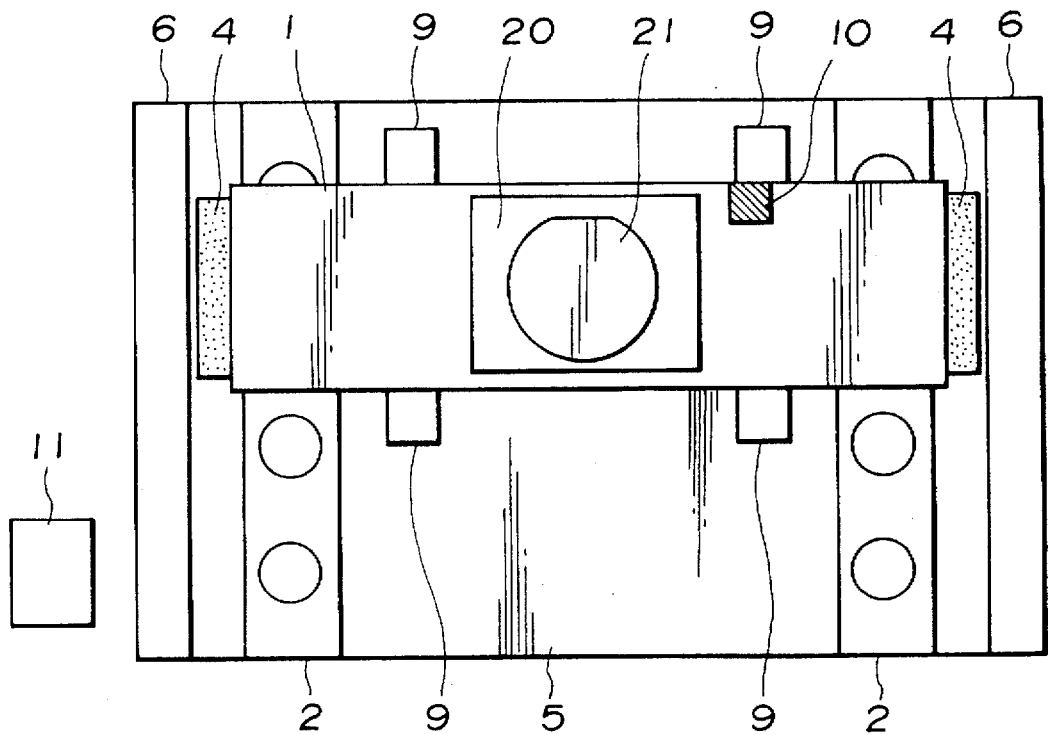

FIGS. 4(a) and 4(b) are diagrams illustrating the configuration of a moving stage apparatus for a semiconductor exposure apparatus according to a second embodiment of the present invention. The apparatus of the present embodiment is characterized by an acceleration detector for detecting the posture of movable member 1. This acceleration detector is added to the configuration shown in FIGS. 1(a) and 1(b). In FIGS. 4(a) and 4(b), an acceleration detector 10 mounted on movable member 1 detects the acceleration of movable member 1 in its moving direction. Acceleration detector 10 is fixed to movable member 1 by bonding, screwing or the like. A detection signal from acceleration detector 10 is input to controller 11.

When a signal as shown in FIG. 3(a) has been input to linear actuators 2 to drive movable member 1, accelerator detector 10 detects the acceleration in the moving direction. The waveform of the detected acceleration is in synchronism with and is similar to the waveform shown in FIG. 3(a). In the present embodiment, instead of the waveform of the signal for driving linear actuators 2 used in the above-described embodiment, the waveform of the acceleration in the moving direction obtained from acceleration detector 10 is made to be an input signal to controller 11. As in the above-described case shown in FIG. 3(c), a voltage having the opposite phase is generated based on the input signal to drive movable member 1. Thus, a change in the posture of movable member 1 is reduced to a very small value, and the same functions and effects as in the above-described embodiment can be obtained.

Third Embodiment

Figure 5A:
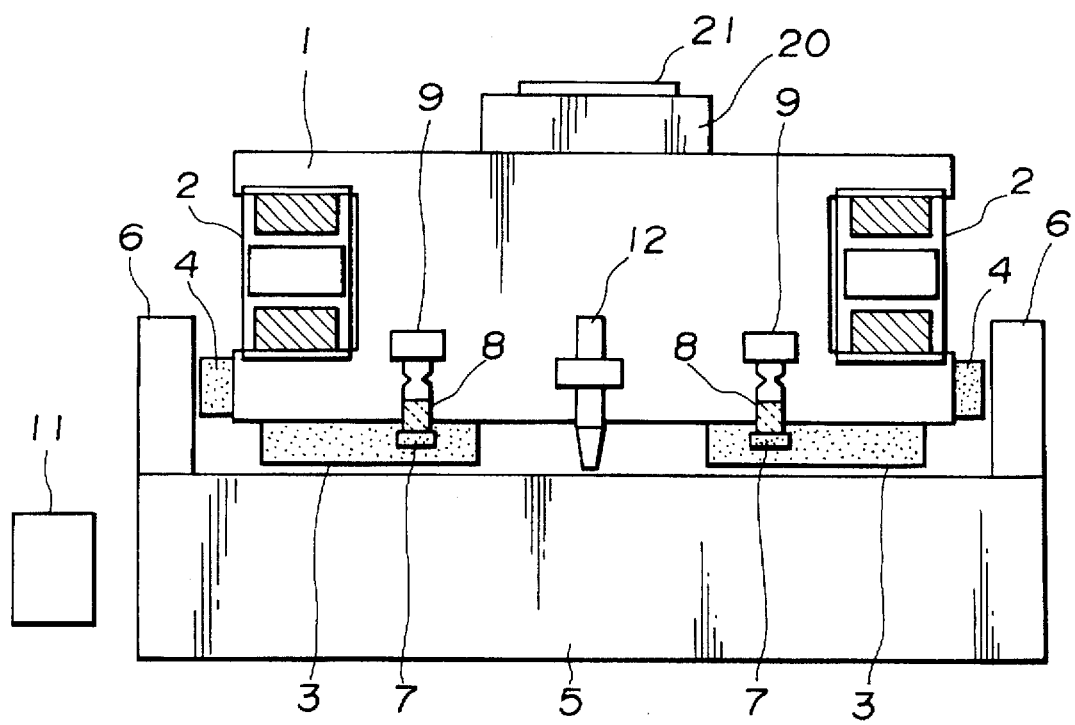
FIGS. 5(a) and 5(b) are front and top views, respectively, illustrating the configuration of an apparatus according to a second embodiment of the present invention.
Figure 5B:
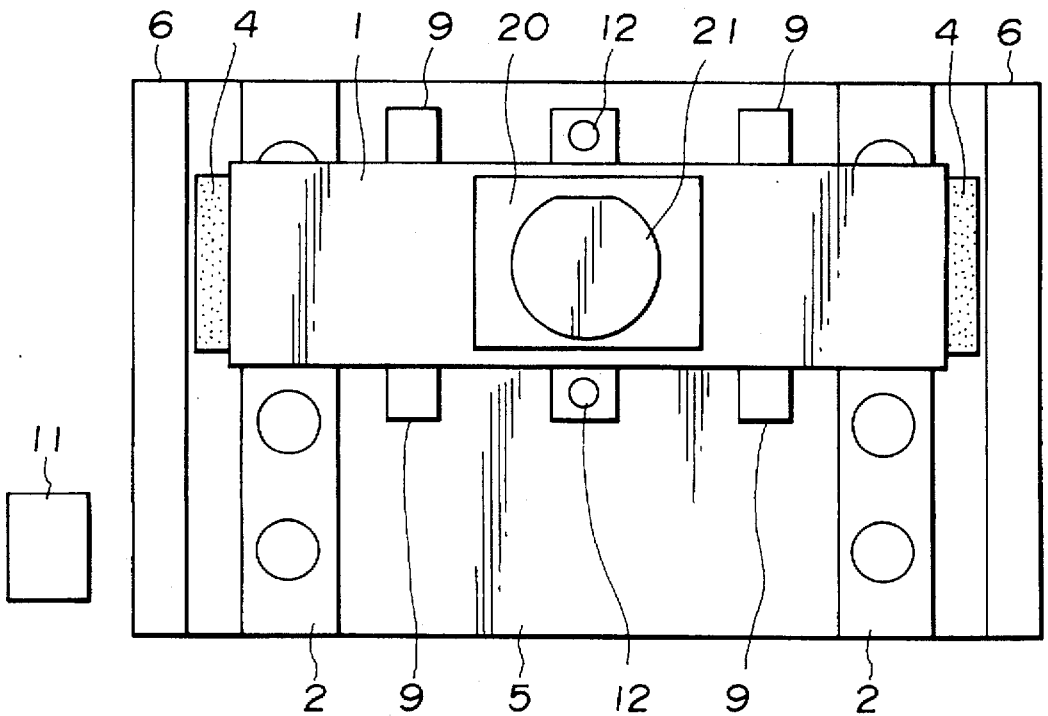

FIGS. 5(a) and 5(b) are diagrams illustrating the configuration of a moving stage apparatus for a semiconductor exposure apparatus according to a third embodiment of the present invention. FIG. 5(a) is a front view of the apparatus, and FIG. 5(b) is a top plan of the apparatus. In the present embodiment, a displacement detector for detecting a change in the posture of movable member 1 is added to the configuration shown in FIGS. 1(a) and 1(b). In FIGS. 5(a) and 5(b), reference numeral 12 represent non-contact-type displacement detectors (for example, capacitance displacement gauges) mounted perpendicularly with respect to guide 5. Displacement detectors 12 detect the displacement of movable member 1 in the vertical direction with respect to the upper surface of guide 5. A detection output from each displacement detector 12 is input to controller 11. By disposing at least one displacement detector 12 in front of and behind movable member 1, a change in the posture of movable member 1 while moving can be detected from the difference between the two amounts of displacement detected by these detectors 12. Controller 11 controls the voltage applied to driving elements 8 so as to cancel the change in the posture based on the detection. Thus, the change in the posture of movable member 1 while moving is reduced to a very small value.

In the present embodiment, since displacement detectors 12 always detect the posture of movable member 1, it is possible to perform static posture compensation as well as dynamic posture compensation. Accordingly, it is also possible to compensate for a decrease in positioning accuracy due to insufficient accuracy in the shape of the guide and the movable member, a change over time of the properties of the materials used in the movable member, and the like.

Fourth Embodiment

Figure 6:
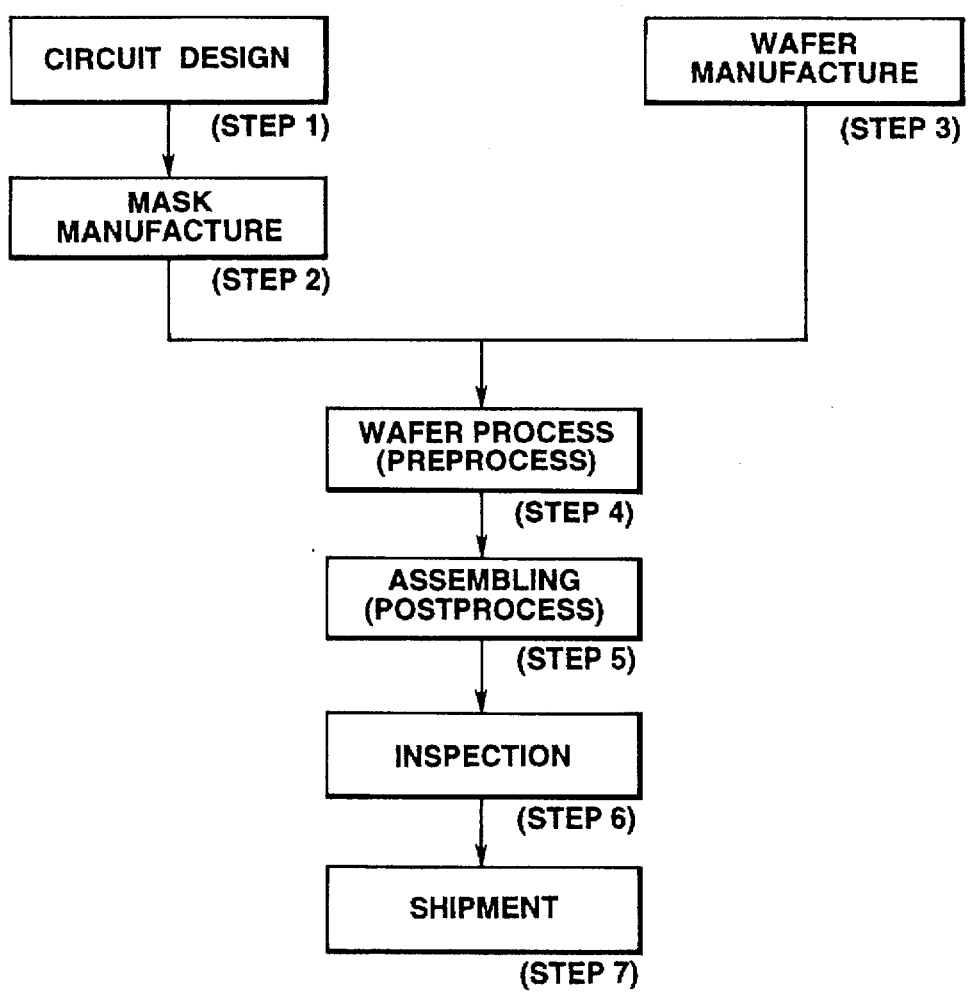
FIG. 6 is a flowchart illustrating a process for manufacturing devices.

Next, a description will be provided of an embodiment relating to a device manufacturing method which utilizes an exposure apparatus including the above-described stage apparatus. FIG. 6 illustrates a flowchart of a method for manufacturing microelectronic devices (semiconductor chips of IC's (integrated circuits), LSI's (large-scale integrated circuits) or the like, liquid-crystal panels, CCD's (charge-coupled devices), thin-film magnetic heads, micromachines or the like. In step 1 (circuit design), circuit design of semiconductor devices is performed. In step 2 (mask manufacture), masks on which designed circuit patterns are formed are manufactured. In step 3 (wafer manufacture), wafers are manufactured using a material, such as silicon or the like. Step 4 (wafer process) is called a preprocess, in which actual circuits are formed on the wafers by means of photolithography using the above-described masks and wafers. The next step (assembling), step 5, is called a postprocess, which manufactures semiconductor chips using the wafers manufactured in step 4, and includes an assembling process (dicing and bonding), a packaging process (chip encapsulation), and the like. In step 6 (inspection), inspection operations, such as operation-confirming tests, durability tests and the like of the semiconductor devices manufactured in step 5, are performed. The manufacture of semiconductor devices is completed after performing the above-described processes, and the manufactured devices are shipped (step 7).

Figure 7:
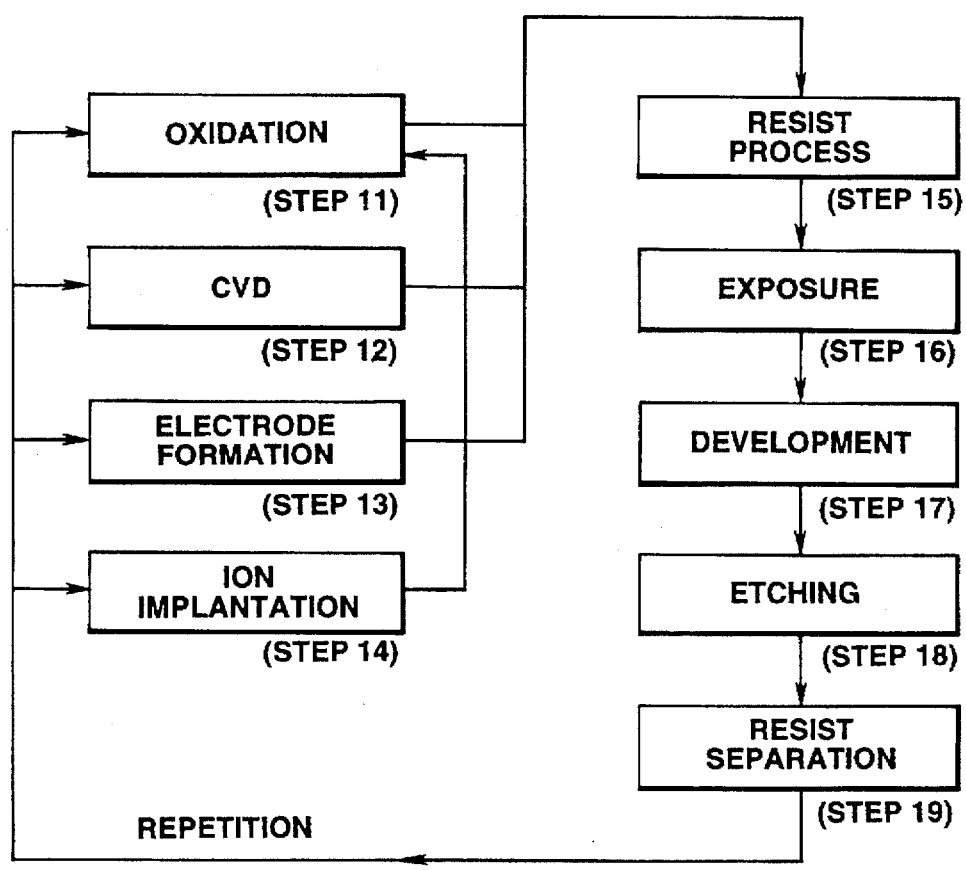
FIG. 7 is a flowchart illustrating a detailed method of a wafer process.

FIG. 7 illustrates a detailed flowchart of the above-described wafer process. In step 11 (oxidation), the surface of the wafer is oxidized. In step 12 (CVD), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed on the wafer by the above-described exposure apparatus. In step 17 (development), the exposed wafer is developed. In step 18 (etching), portions other than the developed resist image are etched off. In step 19 (resist separation), the resist which becomes unnecessary after the completion of the etching is removed. By repeating these steps, a final circuit pattern made of multiple patterns is formed on the wafer. By using the manufacturing method of the present embodiment, it is possible to manufacture semiconductor devices with a high degree of integration which have previously been difficult to manufacture.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A stage apparatus comprising:

a movable member capable of being moved along a reference surface;

first fluid bearing means, connected to said movable member, opposed to the reference surface for supporting said movable member on the reference surface;

second fluid bearing means, different from the first fluid bearing means, opposed to the reference surface and connected to said movable member;

a driving element, fixed to said second fluid bearing means, displacing the second fluid bearing means in a direction perpendicular to the reference surface; and a controller for controlling the displacement of said driving element.

2. An apparatus according to claim 1, wherein said controller controls the displaceable means based on a driving signal for driving the movable member.

3. An apparatus according to claim 1, further comprising an acceleration detector for detecting the acceleration of said movable member in a moving direction, wherein said controller controls the displaceable means based on a detection output of said acceleration detector.

4. An apparatus according to claim 1, further comprising a displacement detector for detecting the displacement of said movable member in a direction perpendicular to the reference surface, wherein said controller controls the displaceable means based on a detection output of said displacement detector.

5. An apparatus according to claim 1, further comprising a linear motor for moving the movable stage along the reference surface.

6. An apparatus according to claim 1, wherein said first fluid bearing means supports substantially the entire weight of said movable member.

7. An apparatus according to claim 1, wherein said displaceable means comprises a piezoelectric element.

8. An apparatus according to claim 1, further comprising exposure means for exposing a substrate mounted on the movable member with radiation.

9. An apparatus according to claim 8, wherein the substrate is a wafer on which the pattern of a mask is to be transferred.

* * * * *